(12) United States Patent
Shany et al.

(10) Patent No.: US 10,389,385 B2
(45) Date of Patent: Aug. 20, 2019

(54) BM-BASED FAST CHASE DECODING OF BINARY BCH CODES THROUGH DEGENERATE LIST DECODING

(71) Applicant: SAMSUNG ELECTRONICS CO., LTD., Suwon-si, Gyeonggi-Do (KR)

(72) Inventors: Yaron Shany, Ramat Gan (IL); Jun Jin Kong, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/409,724

(22) Filed: Jan. 19, 2017

(65) Prior Publication Data

US 2018/0205398 A1 Jul. 19, 2018

(51) Int. Cl.
*H03M 13/00* (2006.01)
*H03M 13/15* (2006.01)
*H03M 13/45* (2006.01)

(52) U.S. Cl.
CPC ..... *H03M 13/1545* (2013.01); *H03M 13/152* (2013.01); *H03M 13/153* (2013.01); *H03M 13/453* (2013.01); *H03M 13/6502* (2013.01)

(58) Field of Classification Search
CPC ........... G06F 11/1068; H03M 13/1515; H03M 13/152; H03M 13/451; H03M 13/1525; H03M 13/3707; H03M 13/153; H03M 13/3769; H03M 13/1545
See application file for complete search history.

(56) References Cited

U.S. PATENT DOCUMENTS

| | | |
|---|---|---|
| 7,793,195 B1 | 9/2010 | Wu |
| 8,245,117 B1 | 8/2012 | Wu |
| 8,650,466 B2 | 2/2014 | Wu |
| 8,674,860 B2 | 3/2014 | Wu |

(Continued)

OTHER PUBLICATIONS

Peter Beelen, et al., "On Rational-Interpolation Based List-Decoding and List-Decoding Binary Goppa Codes," IEEE Transactions of Information Theory, 59(6): 3629-3281, 2013.

(Continued)

*Primary Examiner* — Guerrier Merant
(74) *Attorney, Agent, or Firm* — F. Chau & Associates, LLC

(57) ABSTRACT

An application specific integrated circuit (ASIC) tangibly encodes a method for fast polynomial updates in fast Chase decoding of binary Bose-Chaudhuri-Hocquenghem (BCH) codes. The method includes the steps of using outputs of a syndrome-based hard-decision (HD) algorithm to find a Groebner basis for a solution module of a modified key equation, upon failure of HD decoding of a BCH codeword received by the ASIC from a communication channel; evaluating polynomials obtained from said Groebner basis at inverses of specified weak-bit locations; and transforming a Groebner basis for a set of flipped weak-bit locations $(\alpha_1, \ldots, \alpha_{r-1})$ to a Groebner basis for $(\alpha_1, \ldots, \alpha_r)$, wherein $\alpha_r$ is a next weak-bit location, wherein r is a difference between a number of errors and a HD correction radius of the BCH codeword.

8 Claims, 7 Drawing Sheets

(56) References Cited

U.S. PATENT DOCUMENTS 8,850,298 B2 9/2014 Wu
2016/0301429 A1* 10/2016 Shany ................. G06F 11/1068

OTHER PUBLICATIONS

Ralf Koetter, et al., "Algebraic Soft-Decision Decoding of Reed-Solomon Codes," IEEE Transaction of Information Theory, vol. 49, No. 11, pp. 2809-2825, Nov. 2003.
David Chase, "A Class of Algorithms for Decoding Block Codes With Channel Measurement Information," IEEE Transactions on Information Theory, vol. It-18, No. 1, Jan. 1972.
Peter Trifonov, et al., "Efficient Interpolation in the Wu List Decoding Algorithm," IEEE Transaction on Information Theory, vol. 58, No. 9, Sep. 2012.
Yingquan Wu, "Fast Chase Decoding Algorithms and Architecture for Reed-Solomon Codes," IEEE Transactions on Information Theory, vol. 58, No. 1, Jan. 2012.
Patrick Fitzpatrick, "On the Key Equation," IEEE Transactions on Information Theory, vol. 41, No. 5, Sep. 1995.
Elwyn R. Berlekamp, "Nonbinary BCH Decoding," Institute of Statistics Mimeo Series No. 502, pp. 1-45, Dec. 1966.
Johan S. R. Nielsen, "List Decoding of Algebraic Codes," Department of Applied Mathematics and Computer Science, Technical University of Denmark, pp. 1-182, 2013.

* cited by examiner

BM-BASED FAST CHASE DECODING OF BINARY BCH CODES THROUGH DEGENERATE LIST DECODING

BACKGROUND

Technical Field

Embodiments of the present disclosure are directed to methods of forming error correcting codes.

Discussion of the Related Art

In coding theory, BCH codes form a class of cyclic error-correcting codes (ECCs) that are constructed using finite fields. BCH codes are named for their inventors Raj Bose, D. K. Ray-Chaudhuri, and Alexis Hocquenghem. BCH codes can be defined as follows. For a correction radius t, the primitive binary BCH code of length $2^m-1$ and designed distance $d:=2t+1$ is defined as the cyclic binary code of length $n:=2^m-1$ with roots $\alpha, \alpha^3, \ldots, \alpha^{2t-1}$ and their conjugates, where $\alpha$ is some primitive element in $\mathbb{F}_{2^m}^*$. BCH codes allow a precise control over the number of symbol errors correctable by the code during code design. In particular, it is possible to design binary BCH codes that can correct multiple bit errors. BCH codes can also be easily decoded using an algebraic method known as syndrome decoding. This can simplify the design of the decoder for these codes by using small, low-power electronic hardware.

The syndrome of a received codeword $y=x+e$, where $x$ is the transmitted codeword and $e$ is an error pattern, is defined in terms of a parity matrix H. A parity check matrix of a linear code C is a generator matrix of the dual code $C^\perp$, which means that a codeword c is in C iff the matrix-vector product $Hc=0$. Then, the syndrome of the received word $y=x+e$ is defined as $S=Hy=H(x+e)=Hx+He=0+He=He$. For the high-rate codes commonly used in practice, syndromes are useful in that the length of the syndrome, the codimension of the code, is much less than the length of the received word. For BCH codes, it is useful to work with a syndrome that corresponds to a particular parity-check matrix. For $j \in \{1, \ldots, d-1\}$, let $S_j:=y(\alpha^j)$, where for a field K and a vector $f=(f_0, f_1, \ldots f_{n-1}) \in K^n$, the vector f is identified with the polynomial $f(X):=f_0+f_1X+\ldots+f_{n-1}X^{n-1} \in K[X]$. The syndrome polynomial associated with y is $S(X):=S_1+S_2X+\ldots+S_{d-1}X^{d-2}$. In terms of syndromes, the main computation in decoding binary BCH codes is to determine polynomials $\omega(X), \sigma(X) \in \mathbb{F}_{2^m}[X]$, that satisfy the following equation, known as a key equation:

$$\omega = S\sigma \mod X^{2t},$$

where S is the syndrome polynomial, X is a free variable in the polynomial, $\omega(X) \in \mathbb{F}_{2^m}[X]$ is the error evaluator polynomial, defined by $\omega(X):=\sum_{i=1}^{\in} \alpha_i \Pi_{j \neq i} (1+\alpha_j X)$, $\sigma(X) \in \mathbb{F}_{2^m}[X]$ is the error locator polynomial defined by $\sigma(X):=\Pi_{i=1}^{\in} (1+\alpha_i X)$, $\alpha$ is the primitive element in $\mathbb{F}_2^*m$ that was used to define the roots of the BCH code, $\in$ is the actual number of hard-decision errors, $\alpha_1, \ldots, \alpha_\in$ are the error locations, that is, field elements pointing to the location of the errors, and t is the designed decoding radius of the BCH code.

The Berlekamp-Massey (BM) algorithm is an algorithm for decoding BCH codes that finds an estimated error locator polynomial (ELP) $C(X)=1+C_1X+C_2X^2+\ldots+C_LX^L$ which results in zero coefficients for $X^k$ in $S(X)C(X)$ for $k=L, \ldots, 2t-1$ $[S]_k+C_1[S]_{k-1}+\ldots+C_L[S]_{k-L}=0$, where L is the number of errors found by the algorithm, $N=d-1=2t$ is the total number of syndromes, $[S]_i=S_{i+1}$ is the coefficient of $X^i$ in the syndrome polynomial $S(X)$ for all i, and k is an index that ranges from L to (N-1).

The BM algorithm begins by initializing $C(X)$ to 1, L to zero; $B(X)$ (a copy of the last $C(X)$ since L was updated) to 1, b (a copy of the last discrepancy d since L was updated and initialized) to 1; and m (the number of iterations since L, $B(X)$, and b were updated and initialized) to 1. The algorithm iterates from k=0 to N-1. At each iteration k of the algorithm, a discrepancy d is calculated:

$$d=[S]_k+C_1[S]_{k-1}+\ldots+C_L[S]_{k-L}.$$

If d is zero, $C(X)$ and L are assumed correct for the moment, m is incremented, and the algorithm continues.

If d is not zero and 2L>k, $C(X)$ is adjusted so that a recalculation of d would be zero:

$$C(X)=C(X)-(d/b)X^m B(X).$$

The $X^{th}$ term shifts $B(X)$ to follow the syndromes corresponding to b. If the previous update of L occurred on iteration j, then m=k-j, and a recalculated discrepancy would be:

$$d=[S]_k+C_1[S]_{k-1}+\ldots-(d/b)([S]_j+B_1[S]_{j-1}+\ldots).$$

This would change a recalculated discrepancy to: $d=d-(d/b)b=d-d=0$. Then, m is incremented, and the algorithm continues.

On the other hand, if d is not zero and $2L \leq n$, a copy of C is saved in vector T, $C(X)$ is adjusted as above, B is updated from T, L is reset to (k+1-L), the discrepancy d is saved as b, m is reset to 1, and the algorithm continues.

A Chien search is an algorithm for determining roots of polynomials over a finite field, such as ELPs encountered in decoding BCH codes. Let $\alpha$ be a primitive element of a finite field with a multiplicative subgroup. Chien's search tests the non-zero elements in the field in the generator's order $\alpha^1, \alpha^2, \alpha^3, \ldots$ In this way, every non-zero field element is checked. If at any stage the resultant polynomial evaluates to zero, then the associated element is a root.

Hard information for a received bit is the estimated bit value, i.e., 0 or 1, while "soft information" includes both an estimated value and the reliability of this estimation. This reliability may take many forms, but one common form is the probability, or an estimation of this probability, that the estimation is correct. For example, in the case of a single-level cell (SLC) flash memory, in which each cell stores a single bit, hard information is obtained with a single read (single threshold), while increasingly refined soft information is obtained from additional reads.

In hard-decision (HD) decoding, the hard-information vector (per-coordinate bit estimates) is used as the input of an error-correcting code (ECC) decoder, while in soft-decision (SD) decoding, a soft information vector (per-coordinate reliability vector on top of the hard-information vector) is used as the input of the ECC decoder.

Thus, soft information may be regarded as an estimate of the reliability of each bit estimate, on top of the bit estimates themselves. Hence, bits with a high enough reliability may be considered "strong", while the remaining bits may be considered "weak". For example, in an SLC flash memory, one read, e.g., with threshold level h, results in the HID vector, while two additional reads, e.g., with thresholds $h+\Delta$, $h-\Delta$, may be used to divide bits into strong and weak bits.

Chase decoding is a simple SD decoding algorithm for a code having only an HD decoding block, such as a BCH code. In Chase decoding, if an HD decoding fails, soft information is used to divide the received bits into strong, i.e., reliable, and weak, i.e., unreliable, bits. Suppose there are R weak bits. Some patterns of weak-bits flips are tested, such as all possible $2^R$ flipping possibilities. For each flipping pattern, HD decoding is used. If, for some flipping pattern, the number of post-flipping errors is less than t, the HD correction radius of the code, then the decoding is said to have succeeded.

Now consider binary BCH codes. These codes are widely used in NAND flash applications, both for themselves, and as component codes in generalized concatenated codes. In a conventional Chase decoder, for each tested flipping pattern, a full HD decoder is invoked. This involves a syndrome computation, invoking the BM algorithm to find the ELP, and a Chien search to find the roots of the ELP.

However, if, in moving from pattern i to pattern i+1, a single additional bit is flipped, is it necessary to run a full HD decoder for pattern i+1? One answer is the Welch-Berlekamp (WB) algorithm, which is an interpolation-based fast Chase decoding. The WB algorithm differs from the BM algorithm in that while the BM algorithm starts by calculating syndromes from the received word and then works only with the syndromes, the WB algorithm works directly on the received word. Note that for high-rate codes that are used in flash memories, it is more efficient to work with syndromes, because the total length (in bits) of all syndromes is much smaller than the total length of the received word. Hence, in this case it is worth converting the received word into syndromes once and for all at the beginning of decoding, and then to continue processing only the small syndromes. In addition, entirely replacing an existing BM-based HD decoder by a Welch-Berlekamp decoder is non-trivial, and for high-rate codes, to reduce the complexity of the Welch-Berlekamp algorithm to that of the BM algorithm, it is necessary to use a re-encoding transformation, which requires a new hardware design for the core HD decoder.

Another answer is Wu's algorithm, "Fast Chase Decoding Algorithms and Architectures for Reed-Solomon Codes", IEEE Transactions on Information Theory, Vol. 58, No. 1, January 2012, pgs. 109-129, the contents of which are herein incorporated by reference in their entirety, which is a BM-based fast Chase decoding. In Wu's method, for each additional flipped bit, a calculation similar to the last step of the BM algorithm is performed, instead of the full BM algorithm, and a syndrome re-calculation is not required. Note that a conventional decoder uses the Berlekamp-Massey (BM) algorithm in each trial, so the number of finite field multiplications in the BM algorithm is $O(t^2)$, where t is defined above. In Wu's method, one can use the previous estimation of the ELP to obtain the next estimation in $O(t)$ finite field multiplications. So, instead of naively re-running the BM algorithm, one uses the previous result to save time. Thus, each step is linear in t, instead of quadratic in t. In particular, in Wu's algorithm, each additional flipped bit requires two discrepancy calculations and two polynomial updates. However, the manipulated polynomials typically have a degree that grows from t to the actual number of errors, say, t+r.

Wu also has a heuristic stopping criterion for entering the Chien search. Note that a stopping criterion must never miss the correct error locator, but is allowed to have (rare) false positives. A false positive is just an unnecessary computation. If these unnecessary computations are rare, then they have practically no effect. Wu's stopping criterion never misses the correct error-locator polynomial, and rarely has a false positive, but does result in a small degradation in frame-error rate (FER) as compared to full Chien search.

SUMMARY

According to an embodiment of the disclosure, there is provided an application specific integrated circuit (ASIC) that tangibly encodes a method for fast polynomial updates in fast Chase decoding of binary Bose-Chaudhuri-Hocquenghem (BCH) codes. The method includes the steps of using outputs of a syndrome-based hard-decision (HD) algorithm to find a Groebner basis for a solution module of a modified key equation, upon failure of HD decoding of a BCH codeword received by the ASIC from a communication channel; evaluating polynomials obtained from said Groebner basis at inverses of specified weak-bit locations; and transforming a Groebner basis for a set of flipped weak-bit locations $(\alpha_1, \ldots, \alpha_{r-1})$ to a Groebner basis for $(\alpha_1, \ldots, \alpha_r)$, wherein $\alpha_r$ is a next weak-bit location, wherein r is a difference between a number of errors and a HD correction radius of the BCH codeword.

DETAILED DESCRIPTION OF EXEMPLARY EMBODIMENTS

Figure 1:
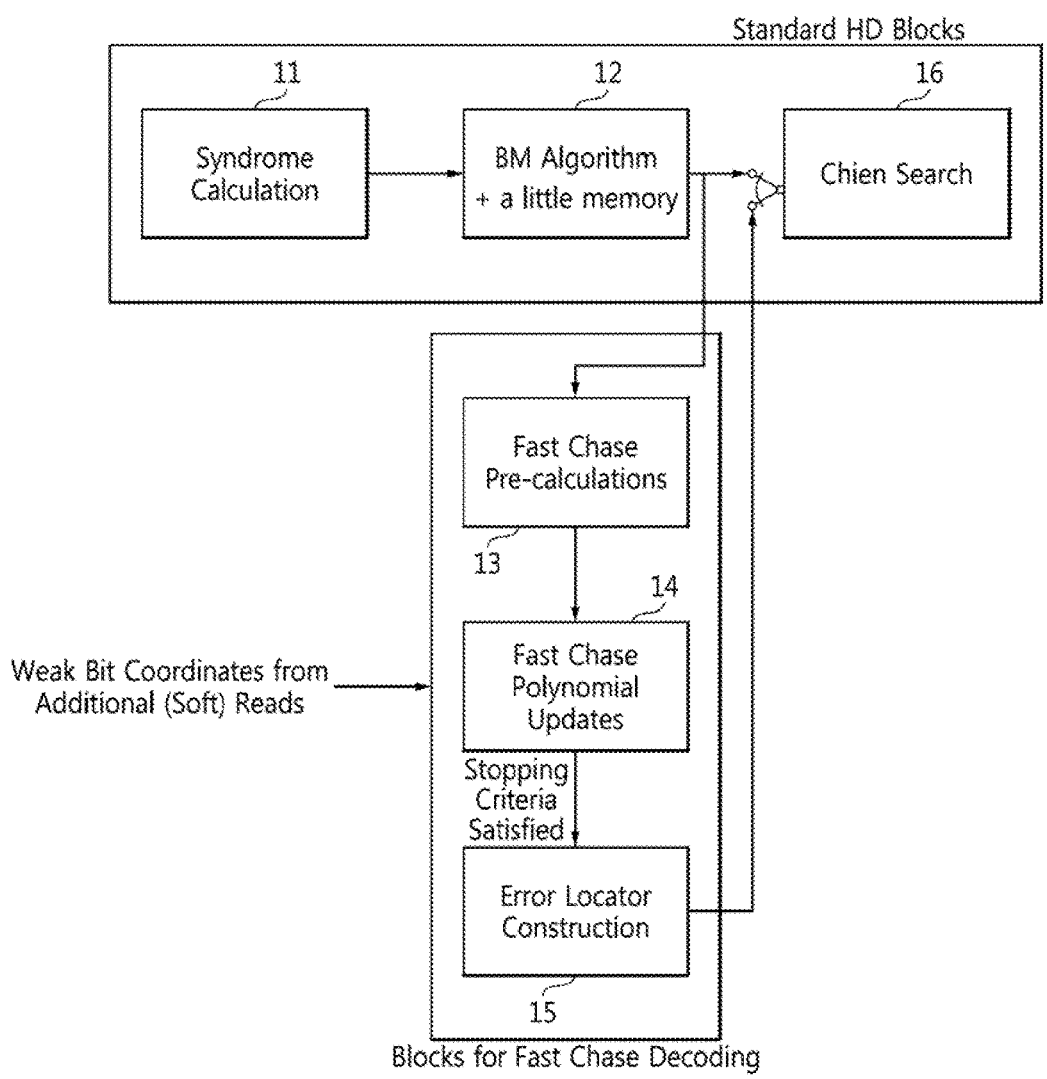
FIG. 1 is a schematic block diagram of a BM-based Chase decoding algorithm according to an embodiment of the disclosure.

Exemplary embodiments of the invention as described herein generally provide systems and methods for performing BM-based fast chase decoding of binary BCH codes. While embodiments are susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention.

Exemplary embodiments of the disclosure as described herein generally include systems and methods for a new polynomial-update algorithm that manipulates polynomials of degrees that typically grow from 0 to only 2r−1, and has a new stopping criterion that differs from Wu's criterion and that avoids unnecessary Chien searches. For example, if t=10 and r=3, Wu's polynomials typically have a degree that grows from 10 to 13. Polynomials in an algorithm according to an embodiment have a degree that typically grows from 0 to 5. A Chase decoder polynomial-update algorithm according to an embodiment is based on the BM algorithm, since the BM algorithm is already implemented and well-understood. Polynomials according to embodiments should be further processed to obtain the desired error-locator polynomial. This has a cost in complexity, but further processing is performed only when the stopping criteria suggests that the correct error-locator polynomial may have been obtained.

This disclosure will use terminology that is substantially similar to that in Massey's 1969 paper, Massey, J. L. (1969), "Shift-register synthesis and BCH decoding", *IEEE Trans. Information Theory*, IT-15 (1): 122-127, the contents of which are herein incorporated by reference in their entirety.

FIG. 1 is a schematic block diagram of a BM-based Chase decoding algorithm according to an embodiment of the disclosure. Referring to the figure, a BM-based Chase decoding algorithm includes a syndrome calculation 11, a BM algorithm 12, fast Chase pre-calculations 13, fast Chase polynomial updates 14, error locator construction 15, and a Chien search 16. Steps 13, 14, and 15 are performed if HI) decoding fails. These steps will be described in detail below.

The syndromes are calculated from a received codeword at step 11 as described above. A BM algorithm as performed at step 12 is a modified version of the BM algorithm described above. A binary BM algorithm according to an embodiment of the disclosure is as follows.

The input is
(a) The correction radius t; and
(b) The syndrome polynomial S(X).

The output is:
(a) A polynomial C(X) such that (SC mod $X^{2t}$, C) is an element of $\tilde{N}_1$ of minimal order, where $\tilde{N}_1:=\{(u,v)\in \tilde{N}|v(0)=1\}$, $\tilde{N}:=\{(u,v)\in \mathbb{F}_{2^m}[X]\times \mathbb{F}_{2^m}[X]|u\equiv Sv \bmod(X^{2t})\}$;
(b) An integer L defined by L:=ord(SC mod $X^{2t}$, C), where ord($f_0,f_1$):=max{deg($f_0$)+1, deg($f_1$)} is the order of ($f_0$, $f_2$);
(c) A polynomial B(X) tracking C(X) before the last length change;
(d) A polynomial $\tilde{B}(X)$ tracking C(X) before the last length change in a virtual BM algorithm, where the virtual BM algorithm minimizes the order in $N_1$, where $$N_1 := \{(u, v) \in N \mid v(0) = 1\},$$

$$N := \left\{(u, v) \in \mathbb{F}_{2^m}[X] \times \mathbb{F}_{2^m}[X] \,\middle|\, u \equiv \frac{S_{even}(X)}{1 + XS_{odd}(X)} v \bmod(X^t)\right\},$$

with an input syndrome $$\frac{S_{even}(X)}{1 + XS_{odd}(X)} \bmod X^t,$$

where $S_{even}(X)$ and $S_{odd}(X)$ are the even and odd parts, respectively, of S(X), defined in general below;
(e) An integer δ tracking the number of indices since the last length change; and
(f) An integer $\tilde{\delta}$ tracking the number of indices since the last length-change in the virtual BM algorithm. Note that $$u \equiv \frac{S_{even}(X)}{1 + XS_{odd}(X)} v \bmod(X^t)$$

is a modified key equation.
The following initializations are performed:
C(X):=1, B(X):=1, $\tilde{B}(X)$:=1, δ:=1, $\tilde{\delta}$:=1, L:=0, b:=1.

A BM algorithm according to an embodiment performs the following iterations.

for k=1 to t:
set d:=Coeff$_{X^{2k-2}}$(SC) //coeff. of $X^{k'-1}$ for k'=2k-1
if d=0, then // minimum LFSR unchanged
  update δ←δ+2
  update $\tilde{\delta}$←$\tilde{\delta}$+1
if d≠0 and 2k-1<2L+1, then // LFSR change w/o length change
  update C(X)←C(X)−d$b^{-1}X^\delta$B(X)
  update δ←δ+2
  update $\tilde{\delta}$←$\tilde{\delta}$+1
if d≠0 and 2k-1≥2L+1, then // length change
  set TMP:=C(X)
  update C(X)←C(X)−d$b^{-1}X^\delta$B(X)
  set B(X):=TMP
  set b:=d
  set δ:=2
  set L':=2k-1-L // next length, temp. storage
  if 2 does not divide L and L'=L+1 // no virtual length change
    update $\tilde{\delta}$←$\tilde{\delta}$+1
  else // virtual length change
    update $\tilde{B}(X)$←B(X)
    set $\tilde{\delta}$:=1
  set L:=L'

Recall that in case of length-change, the BM algorithm saves the last C, i.e., the shortest LFSR before the length change, in B. A modified BM algorithm 12 according to an embodiment of the disclosure uses storage for two B polynomials instead of one, and maintains an additional polynomial B' that is updated as follows. If there is a length change, i.e., when B has to be updated, then B' is unchanged, if L, the minimum LFSR length, is odd and changes to L+1. So, in this case B' has the value of B before the update. Otherwise, B' changes, and is equal to the updated B.

A HD decoding is said to fail if the HD decoder failed to output a valid codeword. Because the HD decoder is limited to correcting up to t errors, if there are more than t errors, the typical result is a decoding failure. A much less probable case is to have an undetected error, in which the number of errors is so large that the decoder outputs some codeword, but this is not the transmitted codeword. If the BM algorithm 12 fails to output a valid codeword, then an algorithm according to embodiments of the disclosure branches to perform the fast Chase pre-calculations 13, the fast Chase polynomial updates 14, and the error locator construction 15, before performing the Chien search 16.

The fast Chase pre-calculations block 13 calculates some values that are unchanged during the fast Chase iterations, and thus can be pre-calculated once in advance.

First, for a field K, define a monomial ordering $<_r$ on $K[X]^2$ as follows: $(X^i, 0)<(X^j, 0)$ iff i<j, $(0,X^i)<(0,X^j)$ iff i<j, and $(X^i, 0)<(0,X^j)$ iff i≤j+r. In addition, for an even integers s∈ℕ, and a polynomial $f(X)=f_0+f_1X+\ldots+f_sX^s\in K[X]$, the odd part of f(X), $f_{odd}(X)$, is $f_{odd}(X):=f_1+f_3X+\ldots+f_{s-1}X^{s/2-1}$, while the even part of f(X), $f_{even}(x)$, is $f_{even}(X):=f_0+f_2X+\ldots+f_sX^{s/2}$. In the above definition, note that $f(X)=f_{even}(X^2)+Xf_{odd}(X^2)$.

Figure 2:
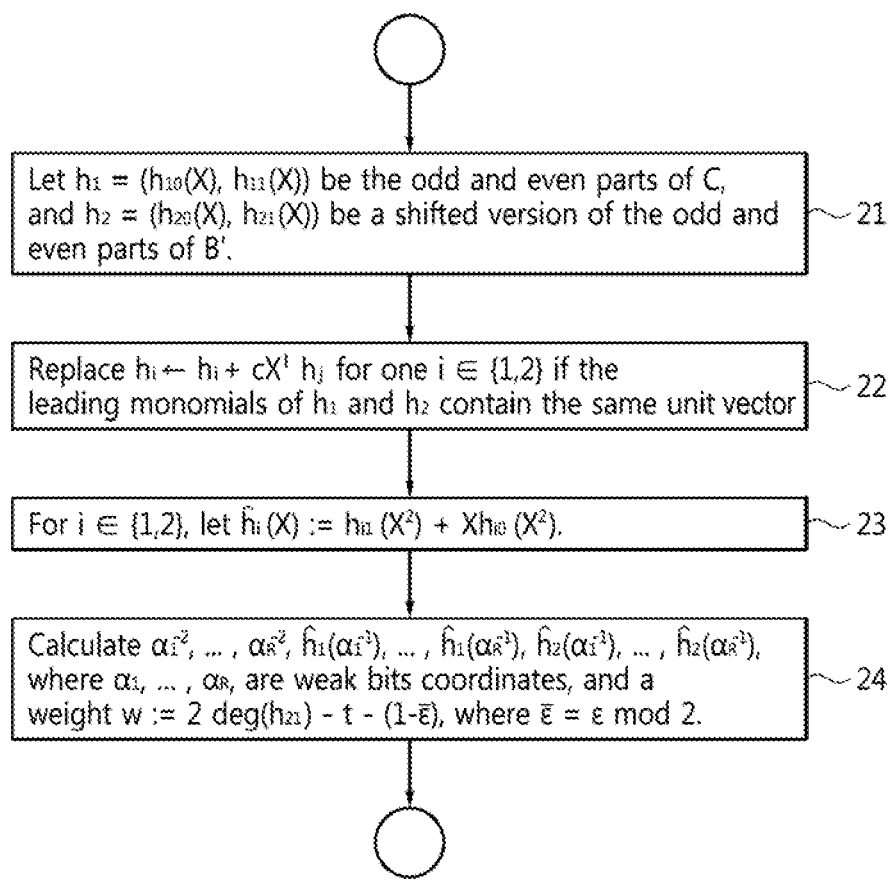
FIG. 2 is a flowchart of a fast Chase pre-calculation according to an embodiment of the disclosure.

FIG. 2 is a flowchart of a fast Chase pre-calculation according to an embodiment of the disclosure. Referring to the figure, at step 21, from the B, C outputs of the BM algorithm, two pairs of polynomials, $h_1=(h_{10}(X), h_{11}(X))$, $h_2=(h_{20}(X), h_{21}(X))$, where X is the free variable, are prepared as follows. Let the pair $h_1$ be the odd and even parts of C, the minimum LFSR output by the BM algorithm. Let the pair $h_2$ be a shifted version, i.e., a multiplied by a power of X, of the odd and even parts of the polynomial B'. If the leading monomials of $h_1$ and $h_2$ with respect to the above monomial ordering contain distinct unit vectors, keep $h_1$ and $h_2$ unchanged, otherwise, at step 22, for exactly one $i \in \{1,2\}$, writing $j:=\{1,2\}\setminus\{i\}$, replace $h_i \leftarrow h_i + cX^l h_j$ for come c and l, where $c \in K^*$ and $l \in \mathbb{N}$ are chosen such that the leading monomial of $h_i$ is canceled. The resulting pair is a Groebner basis for a solution of the modified key equation $$u \equiv \frac{S_{even}(X)}{1+XS_{odd}(X)} v \bmod(X^t)$$

for a $<_{-1}$ monomial ordering. Then, at step 23, for $i \in \{1,2\}$, let $\hat{h}_i(X) := h_{i1}(X^2) + Xh_{i0}(X^2)$. This combines the even and odd parts. Note that no calculations are involved. The polynomials $\hat{h}_1(X)$ and $\hat{h}_2(X)$ are outputs of the pre-calculations block 13.

Next, let the weak bits coordinates be $\alpha_1, \ldots, \alpha_R$. At step 24, the pre-calculations block 13 calculates and outputs $\alpha_1^{-2}, \ldots, \alpha_R^{-2}$, as well as $\hat{h}_1(\alpha_1^{-1}), \ldots, \hat{h}_1(\alpha_R^{-1})$, $\hat{h}_2(\alpha_1^{-1}), \ldots, \hat{h}_2(\alpha_R^{-1})$, and a weight w defined as $w := 2 \deg(h_{21}) - t - (1 - \overline{\in})$, where $\in$ is the total number of errors, and $\overline{\in} = \in \bmod 2$ is assumed known at the negligible cost of losing one information bit.

Figure 3:
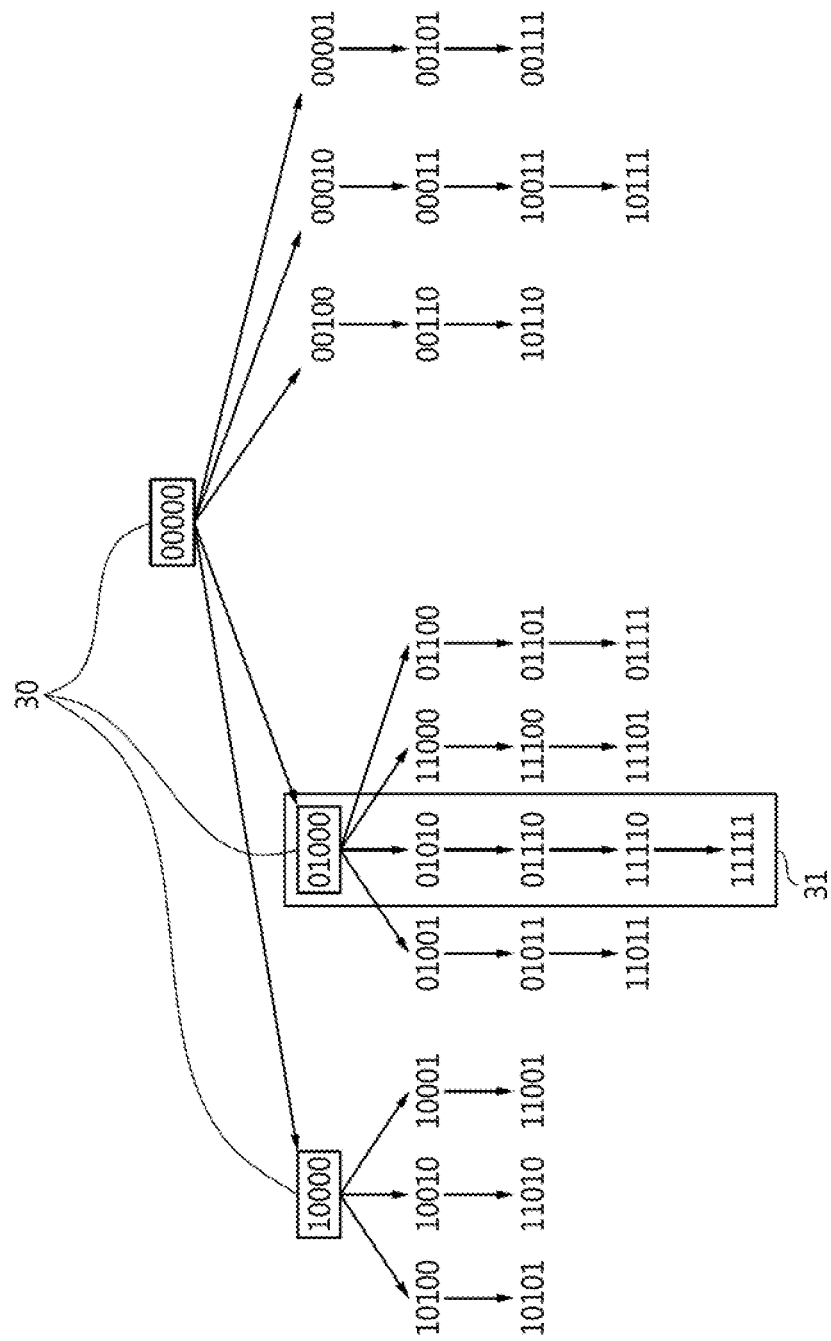
FIG. 3 illustrates an exemplary Wu-type tree for a 5-bit sequence, according to an embodiment of the disclosure.

The polynomial update block uses the quantities pre-calculated by the pre-calculations block 13 along with weak bit coordinates from additional soft reads. Flipping patterns are arranged in a Wu-type tree in which in each path from the root to a leaf, one additional bit is flipped at each level of the tree. An exemplary Wu-type tree for a 5-bit sequence is shown in FIG. 3. Intermediate results may be saved for nodes 30 with more than one child node, which are boxed in the figure. The processing for one edge of the graph of FIG. 3, i.e., the processing for adding one more assumed error, is as follows.

Let the primitive binary BCH code being decoded have length $2^m - 1$, and let K be a finite field defined as $K := F_{2^m}$. Then search for two polynomials $f_1(X), f_2(X) \in K[X]$ such that the error-locator polynomial $\sigma(X)$ is given by $$\sigma(X) = f_1(X^2)\hat{h}_1(X) + f_2(X^2)\hat{h}_2(X),$$

where $\hat{h}_1(X)$ and $\hat{h}_2(X)$ are outputs of the pre-calculations block 13.

Let $\alpha_1, \ldots, \alpha_r \in K$ be a set of potential error locations to be flipped, and consider the following interpolation task. Among all bivariate polynomials $Q(X,Y) = q_0(X) + Yq_1(X)$ of Y-degree of at most one that satisfy the following two conditions:

$$\forall j \text{ s.t. } \hat{h}_1(\alpha_j^{-1}) \neq 0 : Q(\alpha_j^{-2}, \hat{h}_2(\alpha_j^{-1})/\hat{h}_1(\alpha_j^{-1})) = 0; \quad (1)$$

$$\forall j \text{ s.t. } \hat{h}_1(\alpha_j^{-1}) = 0 : \overline{Q}(\alpha_j^{-2}, 0) = 0; \quad (2)$$

where $\overline{Q}(X,Y) := q_1(X) + Yq_0(X)$ is the Y-reversed version of Q, find a polynomial $Q(X, Y)$ that minimizes the (1, w)-weighted degree, defined as $$\max(\deg(q_0), \deg(q_1) + w),$$

where w is an output of the pre-calculations block 13. Let $L = L(\alpha_1, \ldots, \alpha_r)$ be a module of those bivariate polynomials of Y-degree of at most one that satisfy the above two conditions, and let $Q(X, Y)$ by a polynomial on L that minimizes the weighted degree.

The basic ideas of a Chase decoding according to an embodiment are as follows.

1. Correctness: If all of the $\alpha_j$ are actual error locations and $r \geq \in -t$, i.e., there is a correct flipping pattern that is at least as large as that required for a Chase trial, then the sought-after polynomials $f_1(X)$ and $f_2(X)$ appear in $Q(X, F)$, that is, $Q(X, Y) = c \cdot (f_1(X) + Y f_2(X))$, for some non-zero constant c.

2. Groebner Basis: A minimizing $Q(X, Y)$ appears in a Groebner Basis (GB) for L with an appropriate monomial ordering, such as a $<_w$ ordering. Embodiments of the disclosure use GBs with two bivariate polynomials. An appropriate monomial ordering is a defined above with respect to the pre-calculations.

3. Fast Update: If there already exists a GB for $L = L(\alpha_1, \ldots, \alpha_{r-1})$, it is easy to obtain a GB for an additional flipping, that is, for $L(\alpha_1, \ldots, \alpha_{r-1}, \alpha_r)$. A fast Chase update needs an algorithm for moving from a GB for $L(\alpha_1, \ldots, \alpha_{r-1})$ to a GB for $L(\alpha_1, \ldots, \alpha_r)$. According to embodiments, one such algorithm is Koetter's algorithm.

Figure 4:
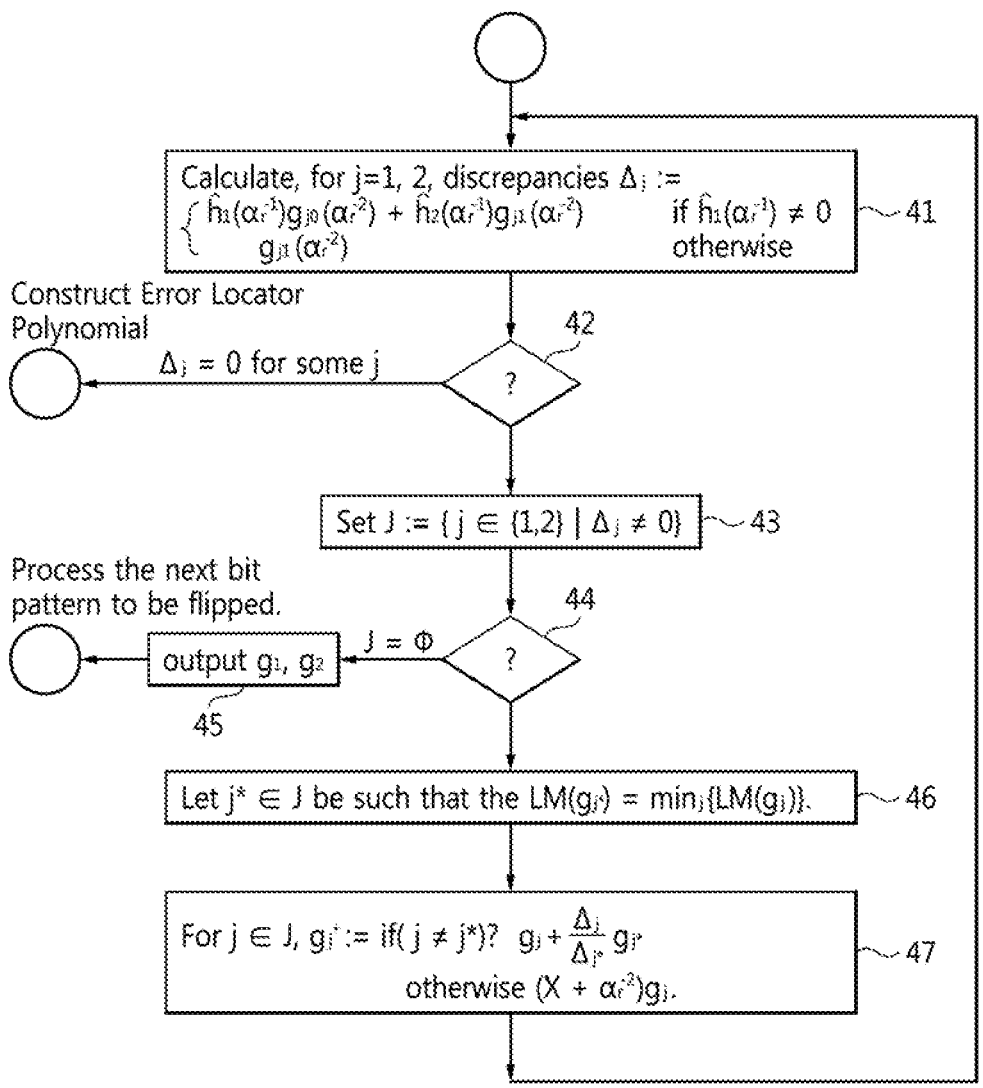
FIG. 4 is a flowchart of a Koetter algorithm that is specialized for fast Chase decoding, according to an embodiment of the disclosure.

Koetter's algorithm solves a more general interpolation than Chase decoding. FIG. 4 is a flowchart of a Koetter algorithm according to an embodiment that is specialized for fast Chase decoding, with a monomial $<_w$ ordering.

The input to a Koetter algorithm according to an embodiment is a GB $\{g_1 = (g_{10}(X), g_{11}(X)), g_2 = (g_{20}(X), g_{21}(X))\}$ for $L(\alpha_1, \ldots, \alpha_{r-1})$ with the leading monomial (LM) of $g_1$ in the first coordinate and the LM of $g_2$ in the second coordinate, and the next error location $\alpha_r$. The output is a GB $\{g^+_1 = (g^+_{10}(X), g^+_{11}(X)), g^+_2 = (g^+_{20}(X), g^+_{21}(X))\}$ for $L(\alpha_1, \ldots, \alpha_{r-1}, \alpha_r)$ with the LM of $g^+_1$ in the first coordinate and the LM of $g^+_2$ in the second coordinate.

Referring now to the figure, an algorithm according to an embodiment begins at step 41 by calculating, for j=, 2, a discrepancy:

$$\Delta_j := \begin{cases} \hat{h}_1(\alpha_r^{-1})g_{j0}(\alpha_r^{-2}) + \hat{h}_2(\alpha_r^{-1})g_{j1}(\alpha_r^{-2}) & \text{if } \hat{h}_1(\alpha_r^{-1}) \neq 0 \\ g_{j1}(\alpha_r^{-2}) & \text{otherwise} \end{cases}.$$

If, at step 42, $\Delta_j = 0$ for some j, exit, and go to error locator construction 15, and Chien search 16. This is a stopping criterion according to an embodiment, and is described below.

An algorithm according to an embodiment continues at step 43 by setting $J := \{j \in \{1,2\} | \Delta_j \neq 0\}$. If, at step 44, $J = \emptyset$, output $g_1, g_2$ at step 45, and process the next error location $\alpha_{r+1}$. Otherwise, at step 46, let $j^* \in J$ be such that the $LM(g_{j^*}) = \min_j\{LM(g_j)\}$, where the LM and the minimization are with respect to the monomial ordering $<_w$, where w is the pre-calculated weight. Then, at step 47, the polynomials are updated: for $j \in J$, $$\text{if } j \neq j^*, \text{ set } g^+_j := g_j + \frac{\Delta_j}{\Delta_{j^*}} g_{j^*};$$

$$\text{otherwise, set } g^+_j := (X + \alpha_r^{-2})g_j,$$

after which the algorithm returns to step 41.

A Koetter algorithm according to an embodiment for fast Chase decoding is called on the edges of Wu's tree, shown in FIG. 3. In particular, when the algorithm is first called, $g_1 = (1,0)$ and $g_2 = (0,1)$. Then, the previous output becomes the next input when one additional bit becomes one in the flipping pattern. For example, consider the following sequence of flipping patterns 31 in the tree shown in FIG. 3, assuming that there are 5 weak bits: 01000→01010→01110→11110→111111. Then the initial GB for the first flipping pattern (single flipped bit, 01000) is $g_1=(1,0)$, $g_2=(0,1)$ and $\alpha_1$ is the field element pointing to the $2^{nd}$ weak bit (01000), and the output GB $(g_1^+, g_2^+)$ becomes the input GB $(g_1, g_2)$, this time with $\alpha_2$ pointing to the fourth weak bit (01010), etc. A Koetter's algorithm according to an embodiment outputs two pairs of polynomials: $g_1^+$ and $g_2^+$. A fast Chase decoder according to an embodiment selects one of the two outputs—the one that has a smaller leading monomial.

Note that if up to r bits within the weak bits are flipped, then the depth of every path from the root to a leaf is at most r. Thus, according to embodiments of the disclosure, after applying a Koetter algorithm according to an embodiment r times, the sum of the degrees of the four involved polynomials is at most 2r−1:

$$\deg(g^+_{10})+\deg(g^+_{11})+\deg(g^+_{20})+\deg(g^+_{21}) \leq 2r-1.$$

Note that it is possible that one of $g^+_{11}$ or $g^+_{20}$ is the zero polynomial, in which case the above formula is meaningless, since $\deg(0)=-\infty$. However, in such a case, it can be verified that the formula still holds when the sum on the left-hand side is only over the non-zero polynomials.

A stopping criterion for a Koetter algorithm according to an embodiment for fast Chase decoding is as follows. Suppose that $\alpha_1, \ldots, \alpha_r$ are correct flipping locations, and that $r = \in-t$, so that an error-locator polynomial can be constructed from the output of a Koetter's algorithm according to an embodiment. However, it is expensive to reconstruct $\sigma(X)$ and perform a Chien search. However, suppose there exists one more erroneous location, $\alpha_{r+1}$, within the weak bits. Then, according to embodiments of the disclosure, in Koetter's iteration for adjoining $\alpha_{e+1}$ to $\alpha_j, \ldots, \alpha_r$, one of the discrepancies will be zero: $\Delta_j=0$ for some j. Thus, checking if one of the $\Delta_j$'s is zero can serve as a stopping criterion. However, it is possible that some $\Delta_j$ is zero even if there is not a correct error-locator polynomial, i.e., $\Delta_j$ is a false positive. The cost of handling a false positive is an increased complexity. However, even if the false positive rate is of the order $\frac{1}{100}$, or even $\frac{1}{10}$, the overall increase in complexity is negligible, and a Monte Carlo simulation can be used to obtain a reliable estimation in such situations. The cost of a stopping criterion according to an embodiment involves performing half an iteration of the discrepancy calculation for a sphere of radius r+1 when $\in-t$ is only r. This reduces the overall complexity gain over a brute force Chien search. When $\in-t=r$, r+1 errors are needed in the weak bits, which slightly degrades the FER in comparison to a brute force Chien search.

After performing the fast Chase polynomial updates and satisfying the stopping criteria, an algorithm constructs an error locator polynomial (ELP), as follows. First, let $j \in \{1,2\}$ be such that $g_j^+ = (g^+_{j0}(X), g^+_{j1}(X))$ is the output of a Koetter's algorithm according to an embodiment, with a minimal leading monomial ordered according to $<_w$. Then the ELP $\sigma(X)$ can be reconstructed, up to a multiplicative constant, from $\sigma(X) = g_{j0}^+(X^2)\hat{h}_1(X) + g_{j1}^+(X^2)\hat{h}_2(X)$. Here, the $\hat{h}_j(X)$ are defined as follows: Letting $\{h_1, h_2\}$ be a Groebner basis for the module N, where $h_1=(h_{10}, h_{11})$ has its leading monomial in the first coordinate and $h_2=(h_{20}, h_{21})$ has its leading monomial in the second coordinate. Then, for i=1,2, define $\hat{h}_i(X) := h_{i1}(X^2) + Xh_{i0}(X^2)$.

Figure 5:
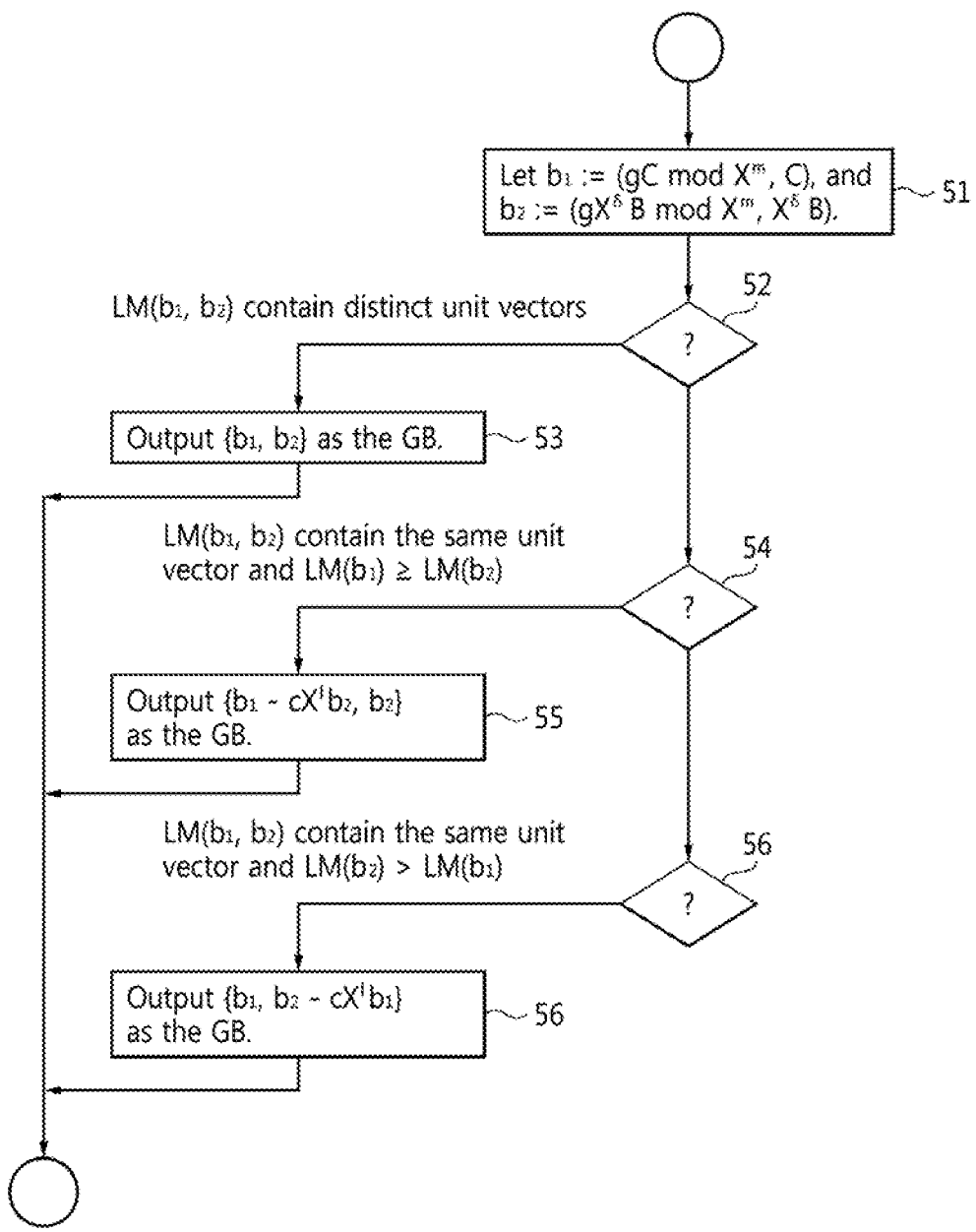
FIG. 5 illustrates a general method to convert the outputs of the standard BM algorithm to a Groebner basis to a generic module N, according to an embodiment of the disclosure.

According to further embodiments of the disclosure, a general method to convert the outputs of the standard BM algorithm to a Groebner basis to a generic module N with respect to the ordering $<_{-1}$ is as follows, as illustrated in the flowchart of FIG. 5. According to an embodiment, a generic module N is defined as $N:=\{(u,v) \in K[X] \times K[X] | u \equiv g\, v \bmod (X^m)\}$, where K is some field, $m \in \mathbb{N}^*$ is some integer, where $\mathbb{N}^*$ is the integers without 0, and $g(X) \in K[X]$ is some polynomial, and $g(X) \neq 0 \bmod X^m$. Referring now to the figure, at step 51, from the outputs C, B, δ of the BM algorithm with inputs m, g, form the following two pairs of polynomials:

$$b_1 := (gC \bmod X^m, C), \text{ and}$$

$$b_2 := (gX^\delta B \bmod X^m, X^\delta B).$$

Then consider three cases, where leading monomials are ordered according to the ordering $<_{-1}$:

(1) If, at step 52, the leading monomials of $b_1$ and $b_2$ contain distinct unit vectors, then output $\{b_1, b_2\}$ as the Groebner basis at step 53;

(2) If, at step 54, the leading monomials contain the same unit vector and the leading monomial of $b_1$ is at least as large as that of $b_2$, then output $\{b_1 - cX^l b_2, b_2\}$ as the GB at step 55, where $c \in K^*$, where $K^*$ is a multiplicative subgroup of K without 0, and $l \in \mathbb{N}$ are chosen such that the leading monomial of $b_1$ is canceled; and (3) If, at step 56, the leading monomials contain the same unit vector and the leading monomial of $b_2$ is strictly larger than that of $b_1$, then output $\{b_1, b_2 - cX^l b_1\}$ as the GB at step 57, where $c \in K^*$ and $l \in \mathbb{N}^*$ are chosen such that the leading monomial of $b_2$ is canceled. Note that these cases cover all possibilities.

According to further embodiments of the disclosure, there is also another way to obtain $h_1$, $h_2$, and consequently $\hat{h}_1$, $\hat{h}_2$, and w, as follows:

1. Calculate the modified syndrome, $$\hat{S} := \frac{S_{even}(X)}{1 + XS_{odd}(X)} \bmod X^t.$$

Note that there is an efficient way to do this, which will be described below.

2. Find a two-element Groebner basis $\{h_1, h_2\}$ for the module $N := \{(u,v) \in \mathbb{F}_{2^m}[X] \times \mathbb{F}_{2^m}[X] | u \equiv \hat{S}v \bmod(X^t)\}$. This can be done in several different ways:
   (a) Apply a conventional BM algorithm to the inputs t and $\hat{S}$, and then convert the outputs C, B, δ to the required Groebner basis $h_1$, $h_2$ using the generic conversion method described above.
   (b) Alternatively, use Fitzpatrick's algorithm.
   (c) Alternatively, use the Euclidean algorithm.

Figure 7:
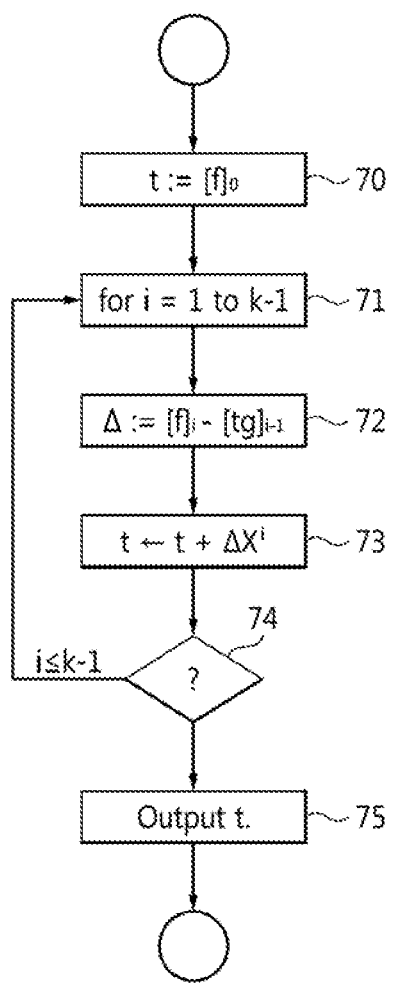
FIG. 7 is a flowchart of another method of obtaining $h_1$, $h_2$, and $\hat{h}_1$, $\hat{h}_2$. and w, according to an embodiment of the disclosure.

Now, the calculation of the modified syndrome concerns the general question of finding $$\frac{f}{1+X_g} \bmod X^k,$$

where f, $g \in K[X]$ are polynomials over some field K and k is some positive integer. For a polynomial $t(X) = t_0 + t_1 X + \ldots t_r X^r$, write $[t(X)]_i := t_i$, the coefficient of $X^r$. For $i \in \{1, \ldots, k\}$, suppose there is a polynomial $t_{i-1}(X)$ that satisfies the following two conditions: (1) $\deg(t_{i-1}) \leq i-1$, and (2) $t_{i-1}(1+Xg) \equiv f \bmod X^i$. Define $\Delta = [f]_i - [t_{i-1}(1+Xg)]_i$. Then, $t_i := t_{i-1} + \Delta X^i$ satisfies conditions (1), (2) above with i+1 instead of i. Note that in the calculation of $\Delta$, finding $[t_{i-1}(1+Xg)]_i$ requires the calculation of one single coefficient of the multiplied polynomials. Furthermore, since $\deg(t_{i-1}) \leq i-1$, then $[t_{i-1}(1+Xg)]_i = [t_{i-1}\, g]_{i-1}$. This leads to a following algorithm according to an embodiment for calculating $$\frac{f}{1+X_g} \mod X^k,$$

with reference to the flowchart of FIG. 7:

| | |
|---|---|
| t := [f]₀ | (Step 70) |
| for i = 1 to k-1 | (Step 71) |
| $\quad \Delta := [f]_i - [t\ g]_{i-1}$ | (Step 72) |
| $\quad t \leftarrow t + \Delta\ X^i$ | (Step 73) |
| end | (Step 74) |
| output t | (Step 75) |

An algorithm according to an embodiment has zero delay, since the coefficient of $X^i$ in the output t is in its final form after the i-th iteration, and can be pipelined with the Groebner basis algorithms of steps 2(a), 2(b) to speed up the processing.

Theoretical Background and Proof of Validity

The validity of the above method for fast Chase decoding will now be explained. In what follows, for a polynomial f, the notation $\overset{even}{f}$, $\overset{odd}{f}$ will sometimes be used for $f_{even}$, $f_{odd}$, respectively.

Definition Define an $\mathbb{F}_{2^m}[X]$-module, L, as follows. As an abelian group, $L = \mathbb{F}_{2^m}[X]$, but the scalar multiplication $\cdot_1$: $\mathbb{F}_{2^m}[X] \times L \to L$ is defined by $f(X) \cdot_1 g(X) := f(X^2)g(X)$. Let $\mu$: $\mathbb{F}_{2^m}[X] \times \mathbb{F}_{2^m}[X] \to L$ be defined by $(u(X),v(X)) \mapsto v(X^2) + Xu(X^2)$, and note that $\mu$ is an isomorphism of $\mathbb{F}_{2^m}[X]$-modules.

Recall that we have defined $$N := \left\{ (u,v) \in \mathbb{F}_{2^m}[X] \times \mathbb{F}_{2^m}[X] \,\bigg|\, u \equiv \frac{\overset{even}{S}(X)}{1 + X\overset{odd}{S}(X)} v \mod(X^t) \right\}$$

as the solution module of the modified key equation. Define also $M = \{u \in \mathbb{F}_{2^m}[X] | u' \equiv Su \mod (X^{2t})\}$, the solution module of the standard key equation in the binary case. The two solution modules are related through the following proposition.

Proposition 1 (Relation between solution modules). M is an $\mathbb{F}_{2^m}[X]$-submodule of L and $\mu(N) = M$. Hence $\mu$ restricts to an isomorphism $\mu': N \overset{\sim}{\to} M$.

Proof. While the first assertion follows from the second, it can be verified directly. First, M is clearly an abelian subgroup of L, and so it remains to verify that for all $f \in \mathbb{F}_{2^m}[X]$ and all $u \in M$, $f \cdot_1 u \in M$. But $(f(X) \cdot_1 u(X))' = (f(X^2)u(X))' = f(X^2)u'(X) \equiv f(X^2)Su = S \cdot (f(X) \cdot_1 u(X))$, where characteristic 2 was used in the second equation, and where $\equiv$ stands for congruence modulo $(X^{2t})$.

Let us now turn to the second assertion. For a polynomial $u \in \mathbb{F}_{2^m}[X]$ we have $u'(X) = \overset{add}{u}(X^2)$, and so u is in M iff $$\overset{odd}{u}(X^2) \equiv \left(\overset{even}{S}(X^2) + X\overset{odd}{S}(X^2)\right)\left(\overset{even}{u}(X^2) + X\overset{odd}{u}(X^2)\right) = \quad (1)$$
$$\overset{even}{S}(X^2)\overset{even}{u}(X^2) + X^2\overset{odd}{S}(X^2)\overset{odd}{u}(X^2) +$$
$$X\left(\overset{odd}{S}(X^2)\overset{even}{u}(X^2) + \overset{even}{S}(X^2)\overset{odd}{u}(X^2)\right).$$

Now, (1) is equivalent to the following pair of equations:

$$\overset{odd}{u}(X^2) \equiv \overset{even}{S}(X^2)\overset{even}{u}(X^2) + X^2\overset{odd}{S}(X^2)\overset{odd}{u}(X^2) \mod(X^{2t}), \quad (2)$$

and $$0 \equiv \overset{odd}{S}(X^2)\overset{even}{u}(X^2) + \overset{even}{S}(X^2)\overset{odd}{u}(X^2) \mod(X^{2t}). \quad (3)$$

So, we have shown that $u \in M$ iff EQS. (2) and (3) are true. To prove the assertion, we will show that for all $u \in \mathbb{F}_{2^m}[X]$, (i) EQ. (3) follows from EQ. (2), so that $u \in M$ iff EQ. (2), and (ii) EQ. (2) is equivalent to $\mu^{-1}(u) \in N$, so that $u \in M$ iff $\mu^{-1}(u) \in N$. Let us start with (ii). Observe that for all u, EQ. (2) is equivalent to $$\overset{odd}{u}(X) \equiv \overset{even}{S}(X)\overset{even}{u}(X) + X\overset{odd}{S}(X)\overset{odd}{u}(X) \mod(X^t). \quad (4)$$

Collecting terms in the last equation, and noting that $$1 + X\overset{odd}{S}(X)$$

has an inverse in $\mathbb{F}_{2^m}[[X]]$, and hence in $\mathbb{F}_{2^m}[X]/(X^i)$ for all i, we see that for all $u \in \mathbb{F}_{2^m}[X]$, EQ. (2) is equivalent to $\mu^{-1}(u) \in N$, as required.

Moving to (i), recall that in the binary case in question, for all i, $S_{2i} = S_i^2$, and hence $$S(X)^2 = S_2 + S_4 X^2 + \ldots + S_{2d-2} X^{2d-4} \equiv \overset{odd}{S}(X^2) \mod(X^{2t}),$$

recall that $d = 2t+1$. Hence $$\left(\overset{even}{S}(X^2) + X\overset{odd}{S}(X^2)\right)^2 \equiv \overset{odd}{S}(X^2) \mod(X^{2t}),$$

that is, $$\left(\overset{even}{S}(X^2)\right)^2 \equiv X^2\left(\overset{odd}{S}(X^2)\right)^2 + \overset{odd}{S}(X^2) \mod(X^{2t}),$$

which is equivalent to $$\left(\overset{even}{S}(X)\right)^2 \equiv X\left(\overset{odd}{S}(X)\right)^2 + \overset{odd}{S}(X) \mod(X^t). \quad (5)$$

Now, to prove (i), assume that EQ. (2) holds, so that EQ. (4) also holds. Multiplying EQ. (4) by $$\overset{even}{S}(X)$$

and writing '$\equiv$' for congruence modulo $(X^t)$, we get $$\overset{odd}{u}(X)\overset{even}{S}(X) \equiv \left(\overset{even}{S}(X)\right)^2 \overset{even}{u}(X) + X\overset{odd}{S}(X)\overset{even}{S}(X)\overset{odd}{u}(X) \overset{(*)}{\equiv}$$
$$\left(1 + X\overset{odd}{S}(X)\right)\overset{odd}{S}(X)\overset{even}{u}(X) + X\overset{odd}{S}(X)\overset{even}{S}(X)\overset{odd}{u}(X),$$

where (*) follows from EQ. (5), which is equivalent to $$\left(1 + X \overset{odd}{S}(X)\right) \overset{odd}{u}(X) \overset{even}{S}(X) \equiv \left(1 + X \overset{odd}{S}(X)\right) \overset{odd}{S}(X) \overset{even}{u}(X).$$

Canceling the term $$1 + X \overset{odd}{S}(X),$$

which is invertible in $\mathbb{F}_{2^m}[X]/(X^t)$, we get $$0 \equiv \overset{odd}{S}(X) \overset{even}{u}(X) + \overset{even}{S}(X) \overset{odd}{u}(X) \bmod(X^t)$$

which is equivalent to EQ. (3), as required.

The following proposition will be useful ahead. We omit the simple proof.

Proposition 2. Let K be A field.
1. For $r \in \mathbb{N}^*$ and for any monomial ordering on $K[X]^r$, let $P \subseteq K[X]^r$ be a submodule with the following property: for all $i \in \{0, \ldots, r-1\}$, there is a vector $f \in P$ such that $LM(f)$ contains the i-th unit vector. Then P has a Groebner basis $\{h_1, \ldots, h_r\}$ with $LM(h_i)$ containing the i-th unit vector for all i.
2. For any $g \in K[X]$ and any $s \in \mathbb{N}^*$, the submodule $P:=\{(u, v) | u \equiv gv \bmod(X^s)\}$ of $K[X]^2$ satisfies the condition of part 1 of the theorem (as clearly $(X^s, 0), (0, X^s) \in P$) and therefore has a two-element Groebner basis $\{h_1, h_2\}$ with $LM(h_1)$ containing (1,0) and $LM(h_2)$ containing (0,1).

Note that in part 1 of the proposition, and hence also in part 2, the Groebner basis is also a free-module basis. The following proposition is a small modification of Proposition 2 of P. Beelen, T. Hoeholdt, J. S. R. Nielsen, and Y. Wu, "On rational interpolation-based list-decoding and list-decoding binary Goppa codes," IEEE Trans. Inform. Theory, vol. 59, no. 6, pp. 3269-3281, June 2013, the contents of which are herein incorporated by reference in their entirety.

Proposition 3. Let $\{h_1=(h_{10}, h_{11}), h_2=(h_{20}, h_{21})\}$ be a Groebner basis for the module N with respect to the monomial ordering $<_{-1}$, and assume without loss of generality that that $LM(h_1)$ contains (1,0) and $LM(h_2)$ contains (0,1). Then
1. $\deg(h_{10}) + \deg(h_{21}) = t$.
2. For $u = (u_0, u_1) \in N$, let $f_1, f_2 \in \mathbb{F}_{2^m}[X]$ be the unique polynomials such that $u = f_1 h_1 + f_2 h_2$. Put $\varepsilon' := \deg(\mu(u)) = \deg(u_1(X^2) + X u_0(X^2))$.
(a) If $\varepsilon'$ is even, so that $\varepsilon' = 2\deg(u_1)$, then $$\deg(f_1(X)) \leq \deg(u_1(X)) - t + \deg(h_{21}(X)) - 1 =: w_1^{even}$$

$$\deg(f_2(X)) = \deg(u_1(X)) - \deg(h_{21}(X)) =: w_2^{even}$$

(b) Otherwise, if $\varepsilon'$ is odd, so that $\varepsilon' = 2\deg(u_0) + 1$, then $$\deg(f_1(X)) = \deg(u_0(X)) - t + \deg(h_{21}(X)) =: w_2^{odd}$$

$$\deg(f_2(X)) \leq \deg(u_0(X)) - \deg(h_{21}(X)) =: w_2^{odd}$$

Definition
1. For $h_i$ (i=1,2) as in the above proposition, let $\hat{h}_i := \mu(h_i)$, so that $\hat{h}_i$ is the polynomial obtained by gluing the odd and even parts specified in $h_i$.
2. Take $u := \mu^{-1}(\sigma)$ in part 2 of the proposition, so that $\varepsilon' = \deg(\sigma) = \varepsilon$ is the number of errors in the received word y. For i=1,2, let $f_i(X) \in \mathbb{F}_{2^m}[X]$ be the unique polynomials from the proposition for this choice of u, and let $$w_i := \begin{cases} w_i^{even} & \text{if } \varepsilon \text{ is even} \\ w_i^{odd} & \text{if } \varepsilon \text{ is odd} \end{cases}.$$

Note that $w_1 + w_2 = \varepsilon - t - 1$, regardless of the parity of $\varepsilon$.

The following proposition is a small modification of p. 148 of J. S. R. Nielsen, "List Decoding of Algebraic Codes," Ph.D. Thesis, Dep. of Applied Mathematics and Computer Science, Technical University of Denmark, 2013, the contents of which are herein incorporated by reference in their entirety. The proof is omitted, which is similar to that appearing in the above reference.

Proposition 4.
1. Suppose that there exists some free-module basis $\{g_1, g_2\}$ for N such that $\gcd(\mu(g_1), u(g_2)) = 1$. Then for any free-module basis $\{h_1, h_2\}$ for N it holds that $\gcd(\mu(h_1), \mu(h_2)) = 1$.
2. N has a free-module basis $\{g_1, g_2\}$ with $\gcd(\mu(g_1), \mu(g_2)) = 1$.

Let us now return to the error-locator polynomial, $\sigma(X)$. Let $\{h_1, h_2\}$ be a GB for N as in Proposition 3, and recall that $\varepsilon = \deg(\sigma)$ is the number of errors in the received word. Let $f_1, f_2 \in \mathbb{F}_{2^m}[X]$ be the unique polynomials such that $\mu^{-1}(\sigma) = f_1 h_1 + f_2 h_2$. Since $\mu$ is a homomorphism, we have $$\sigma = \mu(f_1 h_1 + f_2 h_2) = \qquad (6)$$
$$f_1(X) \cdot_1 \mu(h_1) + f_2(X) \cdot_1 \mu(h_2) = f_1(X^2) \hat{h}_1 + f_2(X^2) \hat{h}_2,$$

that is $$\sigma(X) = f_1(X^2) \hat{h}_1(X) + f_2(X^2) \hat{h}_2(X).$$

Hence, $$\forall x \in \text{Roots}(\sigma, \mathbb{F}_{2^m}), f_1(x^2) \cdot \hat{h}_1(x) + f_2(x^2) \cdot \hat{h}_2(x) = 0, \qquad (7)$$

and also, by Proposition 4, $$\forall x \in \mathbb{F}_{2^m}^*, \hat{h}_1(x) = 0 \Rightarrow \hat{h}_2(x) \neq 0. \qquad (8)$$

Note that $h_1$ and $h_2$ depend only on the received word (through the syndrome), and the decoder's task is to find $f_1, f_2$, as $\sigma$ can be restored from $f_1, f_2$.

The interpolation theorem below indicates how EQ. (7) can be used for finding $f_1$ and $f_2$. Before stating this theorem, we will need some additional definitions, following P. Trifonov, and M. H. Lee, "Efficient interpolation in the Wu list decoding algorithm," IEEE Trans. Inform. Theory, vol. 58, no. 9, pp. 5963-5971, September 2012, the contents of which are herein incorporated by reference in their entirety.

Definition
1. Let K be a field. A polynomial of the form $f(X, Y, Z) := \sum_{j=0}^{\rho} \sum_i a_{ij} X^i Y^j Z^{\rho-j}$ for some $\rho \in \mathbb{N}$, where $a_{ij} \in K$ for all i, j, will be called a (Y,Z)-homogeneous polynomial of (Y,Z)-homogeneous degree $\rho$. We will write $\text{Homog}_{Y,Z}^K(\rho)$ for the K[X]-sub-module of polynomials in K[X, Y, Z] which are (Y, Z)-homogeneous with (Y, Z)-homogeneous degree $\rho$, and set $\text{Homog}_{Y,Z}^K := \cup_{\rho \geq 0} \text{Homog}_{Y,Z}^K(\rho)$.
2. For $f(X, Y, Z) \in \text{Homog}_{Y,Z}^K(\rho)$, let $\tilde{f}(X,Y) := f(X, Y, 1)$. Also, let $\hat{f}(X,Y)$ be the Y-reversed version of $\tilde{f}(X,Y)$, that is, $\hat{f}(X,Y) := Y^\rho \tilde{f}(X, Y^{-1})$. Writing $M_K(\rho)$ for the K[X]-submodule of K[X,Y] consisting of all polynomials of Y-degree at most $\rho$, it can be verified that (•): $\text{Homog}_{Y,Z}^K(\rho) \to M_K(\rho)$ is an isomorphism of K[X]-modules.

With the above definition, we can state the interpolation theorem. In the sequel, $\text{mult}(f,x)$ stands for the multiplicity of $f \in K[X]$, where K is some field and $X = (X_1, \ldots, X_n)$ for some $n \in \mathbb{N}^*$, at the point $x \in K^n$, that is, for the minimum total degree of a monomial appearing in $f(X+x)$. Also, for $w=(w_1, \ldots, w_n) \in \mathbb{Z}^n$, $\text{wdeg}_w(f)$ will stand for the w-weighted degree of f, the maximum of $w_1 i_1 + \ldots + w_n i_n$ over all monomials $X_1^{i_1} \ldots X_n^{i_n}$ appearing in f.

The following theorem can be deduced from the results of Trifonov and Lee.

Theorem 1. (The Interpolation Theorem) For any field K, let $Q(X, Y, Z) \in \text{Homog}_{Y,Z}^K$, and let $f_1(X), f_2(X) \in K[X]$ be polynomials with $\deg(f_1(X)) \leq w'_1$ and $\deg(f_2(X)) \leq w'_2$ for some $w'_1, w'_2 \in \mathbb{N}$. For $e \in \mathbb{N}^*$, let $\{(x_i, y_i, z_i)\}_{i=1}^e \subseteq K^3$ be a set of triples satisfying the following conditions:
1. The $x_i$ are distinct.
2. The $y_i$ and $z_i$ are not simultaneously zero, that is, for all i, $y_i = 0 \Rightarrow z_i \neq 0$.
3. For all i, $z_i f_1(x_i) + y_i f_2(x_i) = 0$.

Then, if $$\sum_{i=1}^{e} \text{mult}(Q(X, Y, Z), (x_i, y_i - z_i)) > \text{wdeg}_{1, w'_1, w'_2}(Q(X, Y, Z)),$$

then $Q(X, f_1(X), f_2(X)) = 0$ in $K[X]$.

Definition For a vector $m = \{m_x\}_{x \in \mathbb{F}_{2^m}^*} \in \mathbb{N}^{\mathbb{F}_{2^m}^*}$ of multiplicities, let $a(m) := \{Q \in \mathbb{F}_{2^m}[X, Y, Z] | \forall x \in \mathbb{F}_{2^m}^*, \text{mult}(Q, (x^2, \hat{h}_2(x), \hat{h}_1(x))) \geq m_{x^{-1}}\}$ be the ideal of all polynomials having the multiplicities specified in m. Also, for $\rho \in \mathbb{N}$, let $M(m, \rho)$ be the $\mathbb{F}_{2^m}[X]$-submodule of $\mathbb{F}_{2^m}[X, Y, Z]$ defined by $$M(m, \rho) := a(m) \cap \text{Homog}_{Y,Z}^{\mathbb{F}_{2^m}}(\rho).$$

The proof of the following proposition is straightforward.

Proposition 5. Let $\tilde{M}(m, \rho)$ be the image of $M(m, \rho)$ under the isomorphism (•). Then $\tilde{M}(m, \rho)$ is the $\mathbb{F}_{2^m}[X]$-module of all polynomials $P \in \mathbb{F}_{2^m}[X, Y]$ satisfying
1. $\text{wdeg}_{0,1}(P) \leq \rho$,
2. For all x with $\hat{h}_1(x) \neq 0$, $$\text{mult}\left(P, \left(x^2, \frac{\hat{h}_2(x)}{\hat{h}_1(x)}\right)\right) \geq m_{x^{-1}}.$$

3. For all x with $\hat{h}_1(x) = 0$ (and hence with $\hat{h}_2(x) \neq 0$), $$\text{mult}(Y^\rho P(X, Y^{-1}), (x^2, 0)) \geq m_{x^{-1}}.$$

Moreover, for a polynomial $R \in M(m, \rho)$, we have $$\text{wdeg}_{1, w_1, w_2}(R) = \text{wdeg}_{1, w_1 - w_2}(\tilde{R}) + w_2 \rho.$$

Hence, if $P \in \tilde{M}(m, \rho)$ has the minimal $(1, w_1 - w_2)$-weighted degree in $\tilde{M}(m, \rho)$, then the $R \in M(m, \rho)$ with $\tilde{R} = P$ has the minimal $(1, w_1, w_2)$-weighted degree in $M(m, \rho)$.

Let us now proceed to a success criterion for decoding. Later, we will show that the validity of fast Chase decoding follows as a special case. The following proposition follows easily from the Interpolation Theorem (Theorem 1).

Proposition 6. Suppose that $I \subseteq \mathbb{F}_{2^m}^*$ is the set of erroneous coordinates (so that $|I| \geq \varepsilon$). Let $J \subseteq \mathbb{F}_{2^m}^*$ be some subset, and for $m \in \mathbb{N}^*$, define m by setting, for all $x \in \mathbb{F}_{2^m}^*$, $$m_x := \begin{cases} m & \text{if } x \in J, \\ 0 & \text{otherwise} \end{cases}.$$

Let also $\rho \in \mathbb{N}^*$. Then if $\varepsilon \geq t+1$ and $$m \cdot |I \cap J| > \frac{|J| \cdot m(m+1)}{2(\rho+1)} + \frac{\rho}{2}(\varepsilon - t - 1), \quad (9)$$

then a non-zero polynomial $\tilde{Q}(X, Y)$ minimizing the $(1, w_1 - w_2)$-weighted degree in $\tilde{M}(m, \rho)$ satisfies $(Yf_2(X) + f_1(X)) | \tilde{Q}(X, Y)$.

For using the previous proposition in our context of fast Chase decoding, let us now consider the special case of Proposition 6 where $\varepsilon \geq t+1$, $\rho=1$, $m=1$, $J \subset I$, and $|J| \geq \varepsilon - t$. This case corresponds to a correct Chase trial, in which a multiplicity of 1 was assigned only to erroneous locations, and to at least $\varepsilon - t$ erroneous locations.

Write $\delta := |J| - (\varepsilon - t) \geq 0$. Then with the current assumptions, EQ. (9) reads $$|J| > \frac{|J|}{2} + \frac{1}{2}(|J| - \delta - 1) = |J| - \frac{1}{2}(\delta + 1),$$

and is therefore satisfied. This immediately shows that fast Chase decoding can be based on the above degenerate case of Wu-like soft decoding, provided that Koetter's algorithm, a point-by-point algorithm, is used for interpolation. Since the Y-degree is limited to $\rho=1$, the list size in this case will be exactly 1, and there is no need in a factorization step.

In detail, suppose that j is indeed a set of error locations with $|J| \geq \varepsilon - t$, and let $\tilde{Q}(X, Y)$ be a non-zero polynomial minimizing the $(1, w_1 - w_2)$-weighted degree in $\tilde{M}(m, \rho)$ for $\rho=1$ and for $m=1_j$, where $1_j \mathbb{F}_{2^m}^* \{0,1\}$ is the indicator function on J.

If $f_2(X) = 0$, then it can be verified that $\sigma = c \cdot \hat{h}_1$ for some constant c. This means that before starting the Chase iterations, the decoder must check whether $\hat{h}_1$ may be an error-locator polynomial.

If $\hat{h}_1$ does not qualify as a potential error-locator polynomial, then the above discussion shows that $f_2 \neq 0$. Assume, therefore, that $f_2 \neq 0$. Since the Y-degree in $\tilde{M}(1_j, 1)$ is upper bounded by $\rho=1$, Proposition 6 shows that there exists some non-zero polynomial $t(X) \in \mathbb{F}_{2^m}[X]$ such that $$\tilde{Q}(X,Y) = t(X) \cdot (Yf_2(X) + f_1(X)). \quad (10)$$

Proposition 7. In EQ. (10), t(X) must be a constant in $\mathbb{F}_{2^m}^*$, so that $f_1$ and $f_2$ can be read off $\tilde{Q}(X,Y)$ without any further calculations.

Proof.

For $x \in \mathbb{F}_{2^m}^*$ with $x^{-1} \in J$, let $$p_x := \begin{cases} \left(x^2, \frac{\hat{h}_2(x)}{\hat{h}_1(x)}\right) & \text{if } \hat{h}_1(x) \neq 0 \\ (x^2, 0) & \text{if } \hat{h}_1(x) = 0 \end{cases}.$$

Letting also $J_1^{-1} := \{x | x^{-1} \in J \text{ and } \hat{h}_1(x) \neq 0\}$ and $J_2^{-1} := \{x | x^{-1} \in J \text{ and } \hat{h}_1(x) = 0\}$, a polynomial of the form $R_0(X) + YR_1(X) \in \mathbb{F}_{2^m}[X,Y]$ is in $\tilde{M}(1_j, 1)$ iff for all $x \in J_1^{-1}$, $(R_0(X) + YR_1(X))(p_x) = 0$, and for all $x \in J_2^{-1}$, $(R_1(X) + YR_0(X))(p_x) = 0$.

With this description in mind, EQS. (7) and (8) show that $Yf_2(X) + f_1(X)$ itself is already in $\tilde{M}(1_j, 1)$. Recall that J is assumed to include only error locations, that is, inverses of roots of $\sigma(X)$. Now, for a non-zero t(X), the $(1, w_1 - w_2)$-weighted degree of $t(X)(Yf_2(X) + f_1(X))$ is strictly larger than that of $Yf_2(X) + f_1(X)$, unless t(X) is a constant. As $\tilde{Q}(X,Y)$ minimizes the weighted degree, this shows that t(X) must be a non-zero constant, as required.

The above discussion justifies Koetter's iterations from FIG. 4.

Let us now turn to the validity of FIG. 2, and briefly describe how the suggested method indeed produces $\hat{h}_1$, $\hat{h}_2$. First, as already stated above, the output of the BM algorithm for the module N, with inputs being the modified syndrome $\hat{S}$ and the integer t, can be used to find a Groebner basis $\{h_1, h_2\}$ for N, where we omit the rather long proof. This means that if we do calculate the modified syndrome, then the BM algorithm for M can be used for obtaining the required Groebner basis.

Let us refer to the BM algorithm with inputs the syndrome S and the integer 2t as the "usual BM algorithm". To completely avoid the calculation of the modified syndrome and, instead, to use the usual BM algorithm, it is possible to apply a method for converting the outputs of the usual BM algorithm to an equivalent of the outputs of the BM algorithm for N. For this, recall first that if $C^{usual} \in \mathbb{F}_{2^m}[X]$ is the output C of the usual BM algorithm, then $C^{usual}$ is in the module M (see, e.g., pp. 25-26 of E. R. Berlekamp, "Nonbinary BCH codes," Institute of Statistics, Mimeo Series no. 502, Department of Statistics, University of North Carolina, December 1966), the contents of which are herein incorporated by reference in their entirety. Consequently, $$ord\left(\overline{SC^{usual}}^{(2t)}, C^{usual}\right) = deg(C^{usual}),$$

where for integer k and a polynomial $g \in \mathbb{F}_{2^m}[X], \overline{g}^{(k)} := g \mod X^k$, a unique representative of degree $\leq k-1$.

Proposition 8. For $f \in \mathbb{F}_{2^m}[X]$, it holds that $$ord(\mu^{-1}(f)) = \left\lceil \frac{deg(f)}{2} \right\rceil. \quad (11)$$

Consequently, $\mu^{-1}(C^{usual})$ has the minimum order in the set $N_1 := \{(u,v) \in N | v(0) = 1\}$.

Proof. We have $$ord(\mu^{-1}(f)) = ord(\overset{odd}{f}, \overset{even}{f})$$

$$\overset{(a)}{=} \begin{cases} deg(\overset{even}{f}) & \text{if } deg(f) \text{ is even} \\ deg(\overset{odd}{f}) + 1 & \text{if } deg(f) \text{ is odd} \end{cases}$$

$$= \left\lceil \frac{deg(f)}{2} \right\rceil,$$

where for (a), note that if deg(f) is even, then $$deg(\overset{even}{f}) > deg(\overset{odd}{f}),$$

while if deg(f) is odd, then $$deg(\overset{odd}{f}) \geq deg(\overset{even}{f}).$$

This proves EQ. (11), and the second assertion is an immediate consequence of EQ. (11).

It follows from the proposition that from the output $C^{usual}$ of the BM algorithm for the inputs S(X) and 2t, we can immediately obtain some element of minimal order in $N_1$ by taking $\mu^{-1}(C^{usual})$. Note that an element of minimal order might not be unique, and the above does not necessarily mean that $\mu^{-1}(C^{usual})$ corresponds to the outputs of the BM algorithm for N. However, using Theorem 3 of Massey's paper, which describes the set of all minimal-order elements in $N_1$, together with the last proposition, it can be verified that the outputs of the modified BM algorithm of the previous section are sufficient for producing the required Groebner basis. The details are omitted.

System Implementations

It is to be understood that embodiments of the present disclosure can be implemented in various forms of hardware, software, firmware, special purpose processes, or a combination thereof. In one embodiment, the present disclosure can be implemented in hardware as an application-specific integrated circuit (ASIC), or as a field programmable gate array (FPGA). In another embodiment, the present disclosure can be implemented in software as an application program tangible embodied on a computer readable program storage device. The application program can be uploaded to, and executed by, a machine comprising any suitable architecture.

Figure 6:
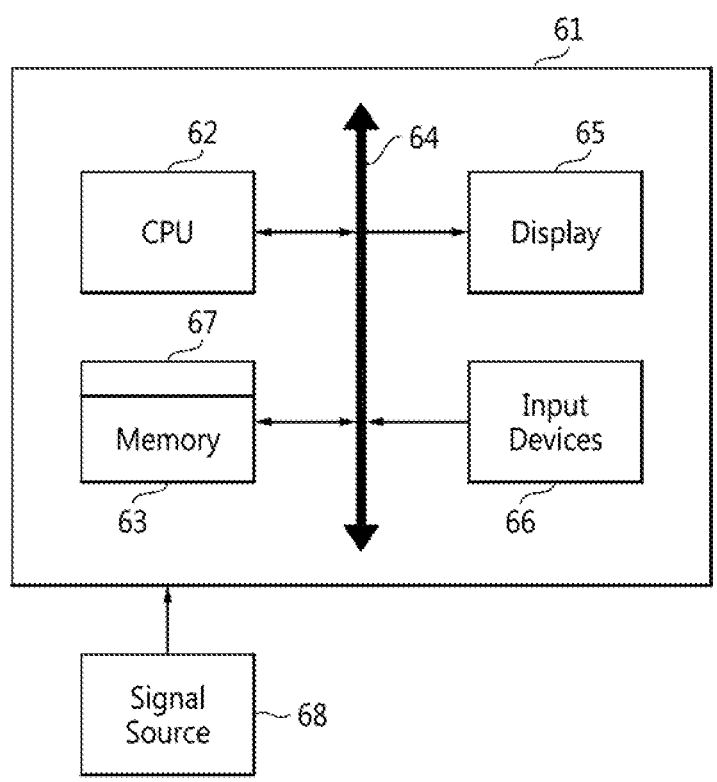
FIG. 6 is a block diagram of a machine for performing BM-based fast chase decoding of binary BCH codes, according to an embodiment of the disclosure.

FIG. 6 is a block diagram of a system for the use of algebraic curves to reduce complexity and the required field size of AMD error detection codes with a block cipher code, according to an embodiment of the disclosure. Referring now to FIG. 6, a computer system 61 for implementing the present invention can comprise, inter alia, a central processing unit (CPU) 62, a memory 63 and an input/output (I/O) interface 64. The computer system 61 is generally coupled through the I/O interface 64 to a display 65 and various input devices 66 such as a mouse and a keyboard. The support circuits can include circuits such as cache, power supplies, clock circuits, and a communication bus. The memory 63 can include random access memory (RAM), read only memory (ROM), disk drive, tape drive, etc., or a combinations thereof. The present disclosure can be implemented as a routine 67 that is stored in memory 63 and executed by the CPU 62 to process the signal from the signal source 68. As such, the computer system 61 is a general purpose computer system that becomes a specific purpose computer system when executing the routine 67 of the present invention. Alternatively, as described above, embodiments of the present disclosure can be implemented as an ASIC or FPGA 67 that is in signal communication with the CPU 62 to process the signal from the signal source 68.

The computer system 61 also includes an operating system and micro instruction code. The various processes and functions described herein can either be part of the micro instruction code or part of the application program (or combination thereof) which is executed via the operating system. In addition, various other peripheral devices can be connected to the computer platform such as an additional data storage device and a printing device.

It is to be further understood that, because some of the constituent system components and method steps depicted in the accompanying figures can be implemented in software, the actual connections between the systems components (or the process steps) may differ depending upon the manner in which the present invention is programmed. Given the teachings of the present invention provided herein, one of ordinary skill in the related art will be able to contemplate these and similar implementations or configurations of the present invention.

While the present invention has been described in detail with reference to exemplary embodiments, those skilled in the art will appreciate that various modifications and substitutions can be made thereto without departing from the spirit and scope of the invention as set forth in the appended claims.

What is claimed is:

1. An application specific integrated circuit (ASIC) tangibly encoding a program of instructions executable by the integrated circuit to perform a method for fast polynomial updates in fast Chase decoding of binary Bose-Chaudhuri-Hocquenghem (BCH) codes, the method comprising the steps of:
   receiving, by the ASIC, a BCH codeword from a communication channel;
   using outputs of a syndrome-based hard-decision (HD) algorithm to find a Groebner basis for a solution module of a modified key equation, upon failure of HD decoding of the BCH codeword received by the ASIC from a communication channel;
   the ASIC evaluating polynomials obtained from said Groebner basis at inverses of specified weak-bit locations;
   the ASIC transforming a Groebner basis for a set of flipped weak-bit locations $(\alpha_1, \ldots, \alpha_{r-1})$ to a Groebner basis for $(\alpha_1, \ldots, \alpha_r)$, wherein $\alpha_r$ is a next weak-bit location, wherein r is a difference between a number of errors and a HID correction radius of the BCH codeword; and
   the ASIC encoding an input data based on the Groebner basis for $(\alpha_1, \ldots, \alpha_r)$,
   wherein transforming a Groebner basis for a module $L(\alpha_1, \ldots, \alpha_{r-1})$ to a Groebner basis for a module $L(\alpha_1, \ldots, \alpha_r)$ comprises:
   initializing a Groebner basis $g_1, g_2$, as $g_1=(g_{10}(X), g_{11}(X))=(1,0)$ and $g_2=(g_{20}(X), g_{21}(X))=(0,1)$;
   calculating, for j=1, 2, a discrepancy $$\Delta_j := \begin{cases} \hat{h}_1(\alpha_r^{-1})g_{j0}(\alpha_r^{-2}) + \hat{h}_2(\alpha_r^{-1})g_{j1}(\alpha_r^{-2}) & \text{if } \hat{h}_1(\alpha_r^{-1}) \neq 0 \\ g_{j1}(\alpha_r^{-2}) & \text{otherwise} \end{cases};$$

and
   determining whether one of the discrepancies $\Delta_j$ is zero, and stopping calculation of the Groebner basis for a module $L(\alpha_1, \ldots, \alpha_r)$, when it is determined that discrepancy $\Delta_j$ is zero,
   wherein after r updates, a sum of degrees of polynomials $g_{10}(X), g_{11}(X), g_{20}(X), g_{21}(X)$ is at most 2r−1.

2. The ASIC of claim 1, wherein a polynomial of the Groebner basis for $(\alpha_1, \ldots, \alpha_r)$ has a degree of at most of order r.

3. The ASIC of claim 1, wherein the syndrome-based HD algorithm is selected from a group that includes the Berlekamp-Massey (BM) algorithm and Fitzpatrick's algorithm.

4. The ASIC of claim 1, wherein using outputs of a syndrome-based HD algorithm to find a Groebner basis for a solution module of a modified key equation comprises:
   setting a polynomial $h_1=(h_{10}(X), h_{11}(X))$ be the odd and even parts of C, respectively, and a polynomial $h_2=(h_{20}(X), h_{21}(X))$ be respectively a shifted version of the odd and even parts of B', wherein polynomials B'(X) and C(X) are output from a Berlekamp-Massey (BM) algorithm performed on syndromes of the BCH codeword, wherein C(X) is such that (SC mod $X^{2t}$, C) is an element of $\tilde{N}_1$ of minimal order, wherein
   $\tilde{N}_1:=\{(u,v)\in\tilde{N}|v(0)=1\}$, $\tilde{N}:=\{(u,v)\in \mathbb{F}_{2^m}[X]\times \mathbb{F}_{2^m}[X] |u\equiv Sv \bmod(X^{2t})\}$, t is a correction radius of the BCH codev,iord, and $S_{even}(X)$ and $S_{odd}(X)$ are even and odd parts of the syndrome polynomial, respectively, and polynomial B'(X) tracks C(X) before a last length change in a virtual BM algorithm, where the virtual BM algorithm minimizes an order in $N_1$, wherein $$N_1 := \{(u, v) \in N \mid v(0) = 1\},$$

$$N := \left\{(u, v) \in \mathbb{F}_2 m[X]\times \mathbb{F}_2 m[X] \mid u \equiv \frac{S_{even}(X)}{1 + XS_{odd}(X)} v \bmod(X^t)\right\},$$

with an input syndrome $$\frac{S_{even}(X)}{1 + XS_{odd}(X)} \bmod X^t$$

and the modified key equation is $$u \equiv \frac{S_{even}(X)}{1 + XS_{odd}(X)} v \bmod(X^t),$$

replacing $h_i \leftarrow h_i+cX^l h_i$ for one $i \in \{1,2\}$, if $h_1$ and $h_2$ do not have a same leading monomial, wherein $c \in K^+$ and $l \in N$ are chosen such that the leading monomial of $h_i$ is canceled; and
   setting $\hat{h}_i(X):=h_{i1}(X^2)+Xh_{i0}(X^2)$, for $i \in \{1,2\}$, wherein $\{h_1(X),h_2(X)\}$ is the Groebner basis for the solution module of the modified key equation.

5. The ASIC of claim 4, wherein evaluating polynomials obtained from said Groebner basis at the inverses of specified weak-bit locations comprises calculating the inverses of the specified weak-bit locations $\alpha_1^{-2}, \ldots, \alpha_R^{-2}$, at the BCH codeword, and evaluating polynomials $\hat{h}_1(\alpha_1^{-1}), \ldots, \hat{h}_1(\alpha_R^{-1}), \hat{h}_2(\alpha_1^{-1}), \ldots, \hat{h}_2(\alpha_R^{-1})$, and further comprising calculating a weight w:=2deg($h_{21}$)−t−(1−$\bar{\epsilon}$), wherein $\bar{\epsilon}=\epsilon$ mod 2 and $\epsilon$ is a total number of errors in the BCH codeword.

6. The ASIC of claim 1, wherein transforming a Groebner basis for a module $L(\alpha_1, \ldots, \alpha_{r-1})$ to a Groebner basis for a module $L(\alpha_1, \ldots, \alpha_r)$ further comprises:
   setting j:=[j∈(1,2)|$\Delta_j \neq 0$];
   outputting $g_1, g_2$ and processing a next error location $\alpha_{r+1}$, if J=Ø, otherwise setting j*∈J such that the LM($g_j^*$) =min$_j$\{LM($g_j$)\}; and
   updating, for $$j \in J, g_j^+ := g_j + \frac{\Delta_j}{\Delta_{j^*}} g_{j^*}, \text{ if } j \neq j^*,$$

and $g_j^+:=(X+\alpha_r^{-2})g_j$, otherwise.

7. The ASIC of claim 1, the method further comprising calculating a final error-locator polynomial δ(X) from a Groebner basis $h_1=(h_{10}, h_{11})$ and $h_2=(h_{20}, h_{21})$ for the solution of the modified key equation and the Groebner basis $g_j^+=(g^+_{j0}(X), g^+_{j1}(X))$ for $(\alpha_1, \ldots, \alpha_r)$ from
   δ(X)=α($g_{j0}^+(X^2)(h_{11}(X^2)+Xh_{10}(X^2))+g_{j1}^+(X^2)(h_{21}(X^2)+Xh_{20}(X^2)))$ wherein a is αmultiplicative constant.

8. A computing system, comprising:
a memory storing a routine encodes a program of instructions executable by an integrated circuit to perform a method for fast polynomial updates in fast Chase decoding of binary Bose-Chandhuri-Hocquenghem (BCH) codes;
an application specific integrated circuit (ASIC) tangibly encoding an input data by using the routine; and
a central processing unit(CPU) executing the routine;
wherein, the routine comprising the steps of:
  receiving, by the CPU, a BCH codeword from a communication channel;
  using outputs of a syndrome-based hard-decision (HD) algorithm to find a Groebner basis for a solution module of a modified key equation, upon failure of HD decoding of the BCH codeword received by the ASIC from a communication channel;
  the CPU evaluating polynomials obtained from said Groebner basis at inverses of specified weak-bit locations;
  the CPU transforming a Groebner basis for a set of flipped weak-bit locations $(\alpha_1, \ldots, \alpha_{r-1})$ to a Groebner basis for $(\alpha_1, \ldots, \alpha_r)$ wherein $\alpha_r$ is a next weak-bit location, wherein r is a difference between a number of errors and a HD correction radius of the BCH codeword; and
  the CPU encoding the input data based on the Groebner basis for $(\alpha_1, \ldots, \alpha_r)$;
  wherein transforming a Groebner basis for a module $L(\alpha_1, \ldots, \alpha_{r-1})$ to a Groebner basis for a module $L(\alpha_1, \ldots, \alpha_r)$ comprises:
  initializing a Groebner basis $g_1$, $g_2$, as $g_1=(g_{10}(X), g_{11}(X))=(1,0)$ and $g_2=(g_{20}(X), g_{21}(X))=(0,1)$;
  calculating, for j=1, 2, a discrepancy $$\Delta_j := \begin{cases} \hat{h}_1(\alpha_r^{-1})g_{j0}(\alpha_r^{-2}) + \hat{h}_2(\alpha_r^{-1})g_{j1}(\alpha_r^{-2}) & \text{if } \hat{h}_1(\alpha_r^{-1}) \neq 0 \\ g_{j1}(\alpha_r^{-2}) & \text{otherwise} \end{cases};$$

and
  determining whether one of the discrepancies $\Delta_j$ is zero, and stopping calculation of the Groebner basis for a module $L(\alpha_1, \ldots, \alpha_r)$, when it is determined that discrepancy $\Delta_j$ is zero,
wherein after r updates, a sum of degrees of polynomials $g_{10}(X), g_{11}(X), g_{20}(X), g_{21}(X)$ is at most 2r−1.

* * * * *